(12) United States Patent
Rittaku et al.

(10) Patent No.: US 8,044,487 B2
(45) Date of Patent: Oct. 25, 2011

(54) SEMICONDUCTOR DEVICE AND METHOD OF MANUFACTURING THE SAME

(75) Inventors: Satoshi Rittaku, Tokyo (JP); Kazuhiro Shimizu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 5 days.

(21) Appl. No.: 11/611,493

(22) Filed: Dec. 15, 2006

(65) Prior Publication Data

US 2007/0187798 A1   Aug. 16, 2007

(30) Foreign Application Priority Data

Feb. 15, 2006   (JP) .................................. 2006-037391

(51) Int. Cl.
*H01L 21/336* (2006.01)
*H01L 29/00* (2006.01)

(52) U.S. Cl. ................. 257/500; 257/501; 257/E21.625; 438/294

(58) Field of Classification Search .................. 257/492, 257/493, 500, 501, 506, 509, E27.064, E29.012, 257/E29.02; 438/294
See application file for complete search history.

(56) References Cited

U.S. PATENT DOCUMENTS

| | | | | |
|---|---|---|---|---|
| 6,392,275 B1 * | 5/2002 | Jang | .............................. | 257/343 |
| 6,638,804 B2 | 10/2003 | Kanda et al. | | |
| 2005/0088898 A1 * | 4/2005 | Hsu et al. | ...................... | 365/222 |
| 2007/0057293 A1 * | 3/2007 | Kao | .............................. | 257/288 |

FOREIGN PATENT DOCUMENTS

| | | |
|---|---|---|
| JP | 63-255938 | 10/1988 |
| JP | 64-77941 | 3/1989 |
| JP | 2003-124343 | 4/2003 |

OTHER PUBLICATIONS

Office Action, in Japanese Patent Application No. 2006-037391, filed Nov. 30, 2010.

* cited by examiner

*Primary Examiner* — Evan Pert
*Assistant Examiner* — Selim Ahmed
(74) *Attorney, Agent, or Firm* — Oblon, Spivak, McClelland, Maier & Neustadt, L.L.P.

(57) ABSTRACT

A semiconductor device including a high voltage element and a low voltage element, including: a semiconductor substrate having high voltage element region where the high voltage element is formed, and a low voltage element region where the low voltage element is formed; a first LOCOS isolation structure disposed in the high voltage element region; and a second LOCOS isolation structure disposed in the low voltage element region, wherein the first LOCOS isolation structure includes a LOCOS oxide film formed on a surface of the semiconductor substrate and a CVD oxide film formed on the LOCOS oxide film, and the second LOCOS isolation structure includes a LOCOS oxide film.

19 Claims, 8 Drawing Sheets

SEMICONDUCTOR DEVICE AND METHOD OF MANUFACTURING THE SAME

CROSS-REFERENCE TO RELATED APPLICATION

The disclosure of Japanese Patent Application No. 2006-37391 filed on Feb. 15, 2006 including specification, drawings and claims is incorporated herein by reference in its entirely.

BACKGROUND OF THE INVENTION

1. Field of the Invention

The present invention is related to a semiconductor device and a method of manufacturing the same, and more particularly, to a semiconductor device, such as a high voltage IC equipped with a high voltage element and a low voltage element, and a method of manufacturing the same.

2. Description of the Related Art

The progress of a high voltage IC (HVIC) has been remarkable over these years. In a high voltage IC, a single chip seats low voltage elements, such as a control circuit and various types of protection circuits, and high voltage elements. For instance, high voltage elements include those elements utilizing a resurf technique such as a horizontal MOS transistor while low voltage elements include CMOS transistors, bipolar transistors, and the like.

FIG. 8 is a cross sectional view of a conventional semiconductor device (a high voltage IC), generally denoted at 500, which includes a high voltage element region 510 and a low voltage element region 520 and which is an example that a horizontal n-ch MOS FET is used as a high voltage element and a CMOS transistor is used as a low voltage element. The semiconductor device 500 includes a $p^-$ semiconductor substrate 1 of silicon. An $n^+$ buried diffusion layer 2 and $n^-$ epitaxial layer 3 are formed on the semiconductor substrate 1. A $p^-$ diffusion region 4, an $n^+$ diffusion region 5 and a $p^+$ diffusion region 6 are formed in the epitaxial layer 3, and a polysilicon electrode 7 and an aluminum electrode 8 are disposed on the epitaxial layer 3. Further, silicon oxide films 9a and 9b are formed on the epitaxial layer 3 by using a LOCOS method. The film thickness of the silicon oxide film 9b formed in the low voltage element region 520 is sufficiently thinner than that of the silicon oxide film 9a formed in the high voltage element region 510 (JP 64-77941, A).

SUMMARY OF THE INVENTION

However, in the case of the semiconductor device 500, since manufacturing steps for the high voltage element region 510 and those for the low voltage element region 520 are not necessarily the same, there are problems that the manufacturing efficiency is poor, the characteristics of the high voltage element and the low voltage element deteriorate, and the like.

Particularly, in the high voltage element region 510, the intensity of an electric field at the surface of the semiconductor substrate 1 needs to be relaxed so that the high voltage element exhibits a stable high voltage characteristic. Hence, the silicon oxide film (LOCOS oxide film) 9a needs to be relatively thick. Meanwhile, forming the LOCOS oxide film thick means an enlarged chip size which goes against the demand to a finer topography and a higher level of integration of a semiconductor device. Hence, in the low voltage element region 520, the film thickness of the LOCOS oxide film for inter-element isolation needs to be as thin as possible since the only expectation upon the LOCOS oxide film is to cause voltage inversion at the surface of the semiconductor substrate 1. In the semiconductor device 500, the silicon oxide films (LOCOS oxide films) 9a and 9b which have different film thicknesses from each other are thus necessary in the high voltage element region 510 and the low voltage element region 520.

To form the two types of the silicon oxide films (LOCOS oxide films) 9a and 9b, however, two thermal oxidation steps are necessary, which causes a problem that the manufacturing process becomes complex. In addition, thermal oxidation at a high temperature over long hours is necessary to form the thick LOCOS oxide film, which causes a problem that large stress acts upon an edge portion of the LOCOS oxide film, and that impurities diffuse in the diffusion layer, and thereby the characteristics of the semiconductor device deteriorate.

Accordingly, an object of the present invention is to provide a semiconductor device in which there are a high voltage element region and a low voltage element region and high voltage elements and low voltage elements exhibit favorable characteristics while the high voltage characteristic of the high voltage elements is ensured, and also to a method of manufacturing such a semiconductor device.

The present invention is directed to a semiconductor device including a high voltage element and a low voltage element, including: a semiconductor substrate having high voltage element region where the high voltage element is formed, and a low voltage element region where the low voltage element is formed; a first LOCOS isolation structure disposed in the high voltage element region; and a second LOCOS isolation structure disposed in the low voltage element region, wherein the first LOCOS isolation structure includes a LOCOS oxide film formed on a surface of the semiconductor substrate and a CVD oxide film formed on the LOCOS oxide film, and the second LOCOS isolation structure includes a LOCOS oxide film.

The present invention is directed also to a method of manufacturing a semiconductor device including a high voltage element and a low voltage element, including: a step of preparing a semiconductor substrate having a high voltage element region where the high voltage element is formed, and a low voltage element region where the low voltage element is formed; a step of forming LOCOS oxide films on the high voltage element region and the low voltage element region; and a CVD step of forming a CVD oxide film on the LOCOS oxide film in the high voltage element region, thereby forming an isolation structure formed of the LOCOS oxide film and the CVD oxide film.

According to the present invention, it is thus possible to provide a semiconductor device having a high voltage element region and a low voltage element region, which exhibits favorable characteristics. It is also possible to provide a simple method of manufacturing such a semiconductor device.

DETAILED DESCRIPTION OF THE PREFERRED EMBODIMENTS

Embodiment 1

Figure 1:
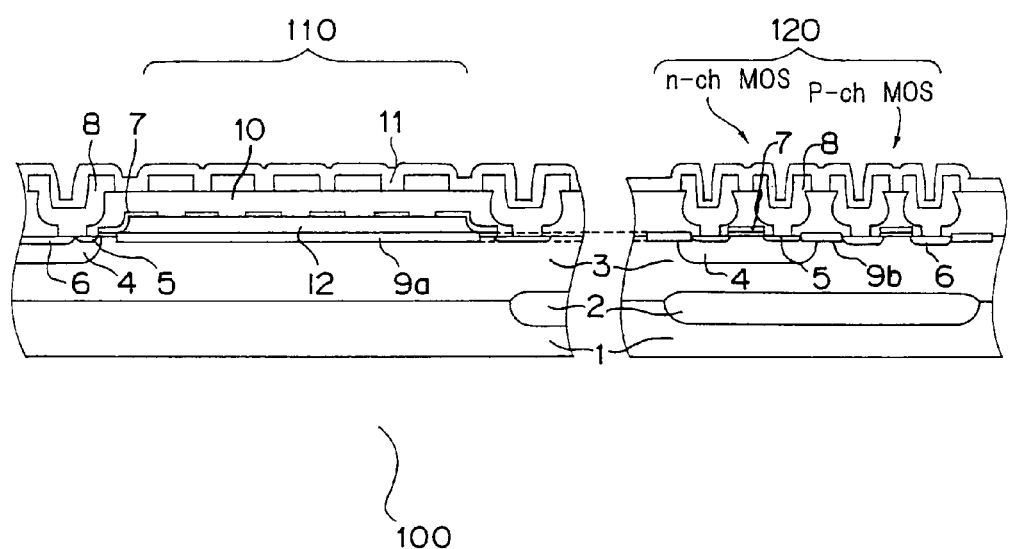
FIG. 1 is a cross sectional view of a semiconductor device according to an embodiment 1 of the present invention.

FIG. 1 is a cross sectional view of the semiconductor device according to the embodiment 1 of the present invention, generally denoted at 100. The semiconductor device 100 includes a high voltage element region 110 in which there is a horizontal MOS transistor (high voltage element) and a low voltage element region 120 in which there is a CMOS transistor (low voltage element).

The semiconductor device 100 includes a p$^-$ silicon substrate 1. An n$^+$ buried diffusion layer 2 and an n$^-$ epitaxial layer 3 are formed on the silicon substrate 1.

In the high voltage element region 110, a p$^-$ diffusion region 4 which will serve as a well region is formed in the epitaxial layer 3. An n$^+$ diffusion region 5 and a p$^+$ diffusion region 6 are formed in the diffusion region 4. The n$^+$ diffusion region 5 and the p$^+$ diffusion region 6 will serve as source regions. For inter-element isolation, the surface of the epitaxial layer 3 includes a silicon oxide film 9a which is formed by a LOCOS method. The silicon oxide film 9a has the same film thickness as that of a silicon oxide film 9b, which is described later, located in the low voltage element region 120.

The silicon oxide film 9a seats a silicon oxide film (CVD oxide film) 12 which is formed by a CVD method. On the epitaxial layer 3, a polysilicon electrode 7 which will serve as a field plate (FP) is disposed via an oxide film (not shown). An insulation layer 10 of silicon oxide is disposed on the polysilicon electrode 7, and an aluminum electrode 8 is disposed on the insulation layer 10. The aluminum electrode 8 is connected with the n$^+$ diffusion region 5 and the p$^+$ diffusion region 6 and will serve as a source electrode. A protection film 11 of silicon nitride is disposed on the aluminum electrode 8.

In the semiconductor device 100, the film thickness of the silicon oxide film 9a is approximately the same as that of the silicon oxide film 9b as described above. Further, a silicon oxide film 12 is disposed on the silicon oxide film 9a, and the total thicknesses of these two oxide films is about the same or greater than that of the LOCOS oxide film formed in the high voltage element region of the conventional semiconductor device 500.

Figure 2A:
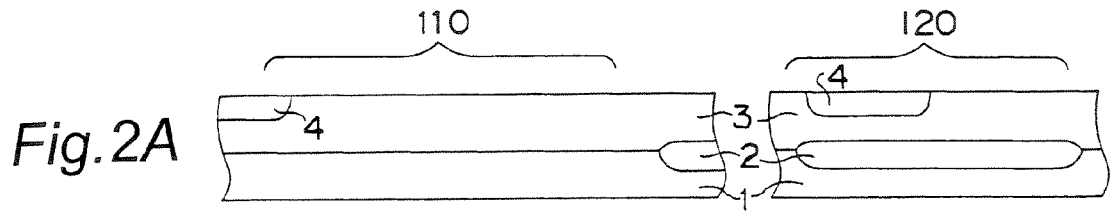
FIGS. 2A through 2G show cross sectional views of steps for manufacturing the semiconductor device according to the embodiment 1 of the present invention.
Figure 2B:
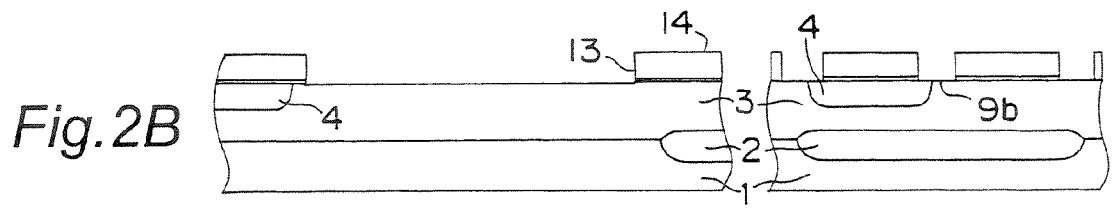
Figure 2C:
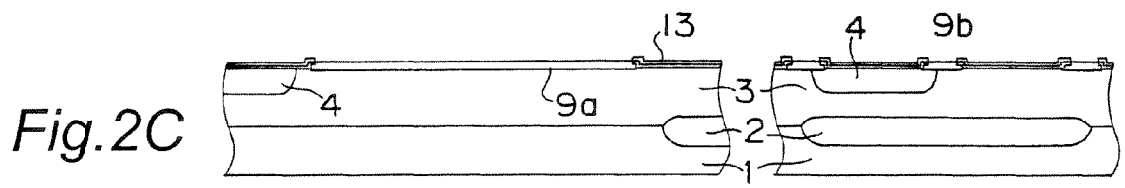
Figure 2D:
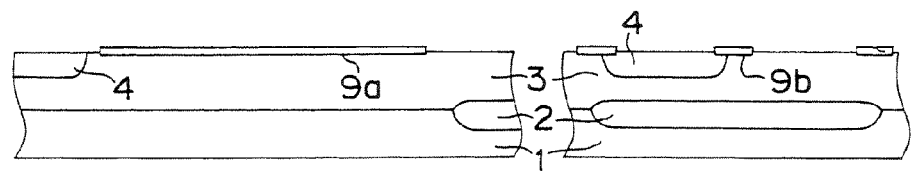
Figure 2E:
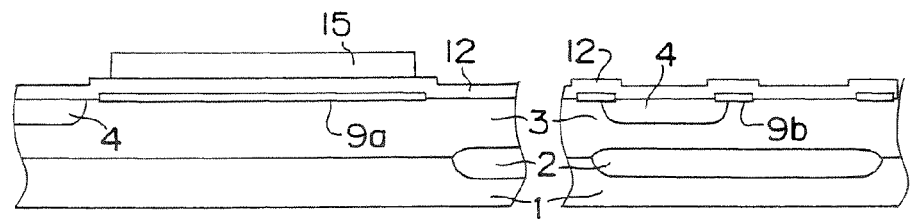
Figure 2F:
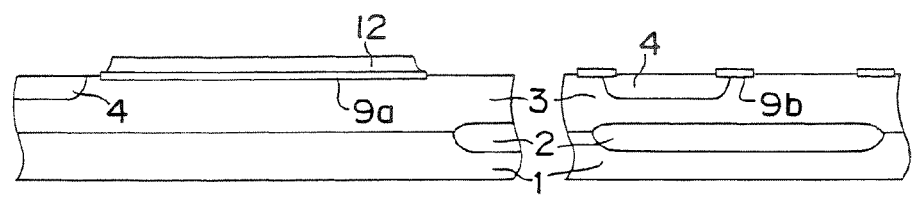
Figure 2G:
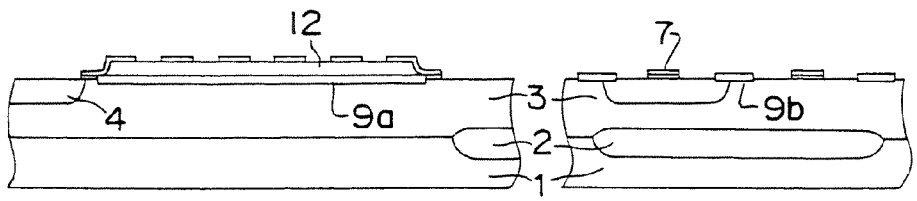

A method of manufacturing the semiconductor device 100 will now be described with reference to FIGS. 2A through 2G. FIGS. 2A through 2G show cross sectional views of steps for manufacturing the semiconductor device 100. In FIGS. 2 through 2G, those portions denoted at the same reference symbols as those used in FIG. 1 denote the same or corresponding portions. This manufacturing method includes the following steps 1 through 7.

Shown on the left-hand sides in FIGS. 2A through 2G are the high voltage element regions 110, whereas shown on the right-hand sides are the low voltage element regions 120.

Step 1: As shown in FIG. 2A, the n$^-$ buried diffusion layer 2 is formed on the p$^-$ silicon substrate 1. The n$^-$ epitaxial layer 3 is then formed. Further, the p$^-$ diffusion region 4 is formed by a thermal diffusion method.

Step 2: As shown in FIG. 2B, after forming a pad oxide film (not shown) and a nitride film 13, a photolithographic photoresist is applied. This is followed by exposure and development of this photoresist, whereby a resist mask 14 is formed. Using the resist mask 14, the nitrogen film 13 is thereafter patterned. The surface of the semiconductor substrate 1 exposed as a result of patterning serves as LOCOS oxide film forming regions.

Step 3: As shown in FIG. 2C, using the nitrogen film 13 as a mask, the silicon substrate 1 is selectively oxidized, thereby forming the silicon oxide films (LOCOS oxide films) 9a and 9b at the same time. The film thickness of the silicon oxide film 9a is approximately the same as that of the silicon oxide film 9b.

Step 4: As shown in FIG. 2D, the nitrogen film 13 and the pad oxide film (not shown) are removed. This exposes the surface of the semiconductor substrate 1 around the silicon oxide films 9a and 9b.

Step 5: As shown in FIG. 2E, the silicon oxide film (CVD oxide film) 12 is formed so as to cover the surface of the semiconductor substrate 1 which seats the silicon oxide films 9a and 9b. The silicon oxide film 12 is formed by a CVD method. A photolithographic resist mask 15 is then formed at a similar step to Step 2. The resist mask 15 is formed on the silicon oxide film 12 above the silicon oxide film 9a.

Step 6: As shown in FIG. 2F, the silicon oxide film 12 is patterned using the resist mask 15, leaving the silicon oxide film 12 on the silicon oxide film 9a. For example, the film thicknesses of the silicon oxide films (LOCOS oxide films) 9a and 9b are about 100 through 800 nm while the film thickness of the silicon oxide film 12 is 300 through 2000 nm.

The silicon oxide film 12 is patterned through wet etching. Under an etching condition which ensures that the ratio of the etching rate of the silicon oxide film 12 to that of the silicon oxide films 9a and 9b (the etching speed of the silicon oxide film 12/the etching speed of the silicon oxide films 9a and 9b) is 2 to 3, which prevents over etching of the silicon oxide films 9a and 9b.

Step 7: As shown in FIG. 2G, the polysilicon electrode 7 which will be a field plate is formed via an oxide film. Meanwhile, in the high voltage element region 110, this is formed on the p$^-$ diffusion region 4 which will be a well region and on the silicon substrate 1, whereby gate electrodes of a p-ch MOS transistor and an n-ch MOS transistor of the CMOS transistor are obtained.

After selectively forming the n$^+$ diffusion region 5 and the p$^+$ diffusion region 6 by a thermal diffusion method, the insulation layer 10, the aluminum electrode 8, the protection film 11 and the like are formed, which completes the semiconductor device 100 shown in FIG. 1.

Where the method of manufacturing the semiconductor device 100 according to the embodiment 1 is used therefore, since the film thicknesses of the silicon oxide films 9a and 9b formed by the LOCOS method are very thin, it is possible to prevent development of stress upon the edge portions of the LOCOS oxide films. Further, since the period of time for high-temperature process is short, diffusion of impurities in the diffusion layer is prevented. This realizes the semiconductor device 100 which exhibits favorable element characteristics.

In addition, since it is not necessary to form the two types of the silicon oxide films 9a and 9b at separate steps, the silicon oxide films having desired film thicknesses are formed at a simple step.

FIGS. 3A through 3D show cross sectional views of other steps for manufacturing the semiconductor device 100 according to the embodiment 1. In FIGS. 3A through 3D, those portions denoted at the same reference symbols as those used in FIG. 1 denote the same or corresponding portions. This manufacturing method includes the following steps.

Figure 3A:
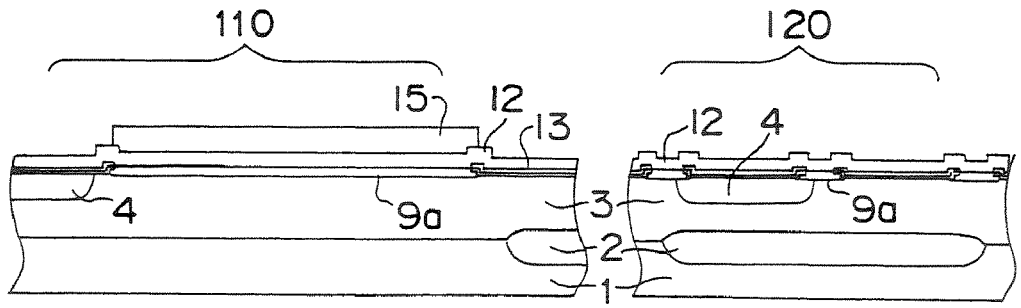
FIGS. 3A through 3D show cross sectional views of other steps for manufacturing the semiconductor device according to the embodiment 1 of the present invention.

Step 1: As shown in FIG. 3A, the silicon oxide films 9a and 9b are formed by the LOCOS method using the nitrogen film 13 as a mask, by a similar process to the Steps 1 through 3 (FIG. 2A through 2C) described above. Following this, the silicon oxide film 12 is formed by the CVD method while leaving the nitrogen film 13 and the pad oxide film (not shown). Further, the photolithographic resist mask 15 is then formed on the silicon oxide film 12 above the silicon oxide film 9a. The resist mask 15 is formed so that its edge overlaps the nitrogen film 13.

Figure 3B:
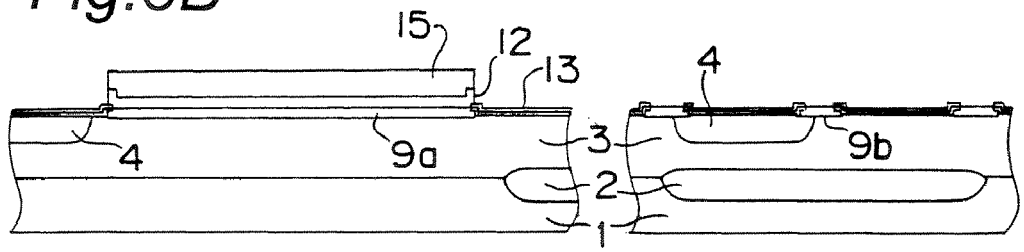

Step 2: As shown in FIG. 3B, through wet etching which uses the resist mask 15, the silicon oxide film 12 is patterned. Wet etching is performed so that the silicon oxide film 12 overlapping the nitrogen film 13 gets removed as side etching proceeds.

Figure 3C:
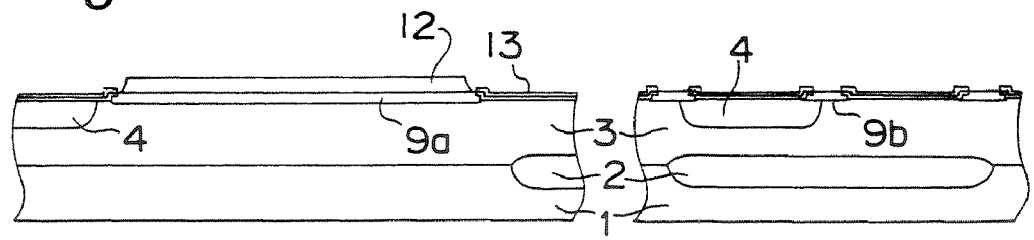

Step 3: As shown in FIG. 3C, the resist mask 15 is removed. This leaves the silicon oxide film 12 which is shaped as show in FIG. 3C.

Figure 3D:
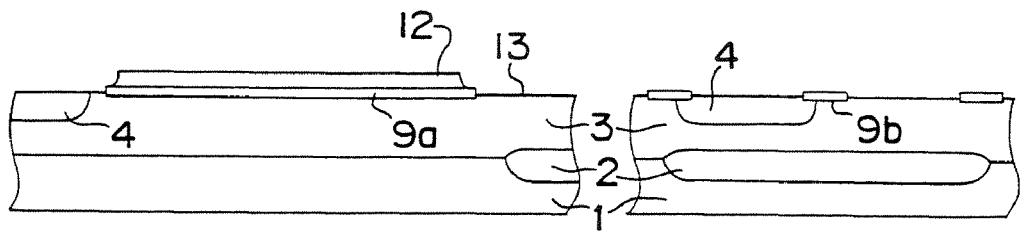

Step 4: As shown in FIG. 3D, the nitrogen film 13 and the pad oxide film (not shown) are removed. This is followed by the above-mentioned Step 7 (FIG. 2G) and the subsequent steps, which completes the semiconductor device 100.

According to this manufacturing method, it is possible to prevent thinning of the film thicknesses in the edge portions of the silicon oxide films (LOCOS oxide films) 9a and 9b during wet etching of the silicon oxide film 12. Further, since the silicon oxide film 12 is etched with the surface of the semiconductor substrate 1 coated with the nitrogen film 13, it is possible to protect the active regions (element forming regions) during etching.

The embodiment 1 has been described in relation to an example that a MOS transistor is used as a high voltage element and a CMOS transistor is used as a low voltage element, an IGBT utilizing a resurf technique which operates at a voltage of 50 through 1200 may be used as a high voltage element and a bipolar transistor which operates at approximately 3 through 40 volts may be used as a low voltage element (which similarly applies to the embodiments below).

Embodiment 2

Figure 4:
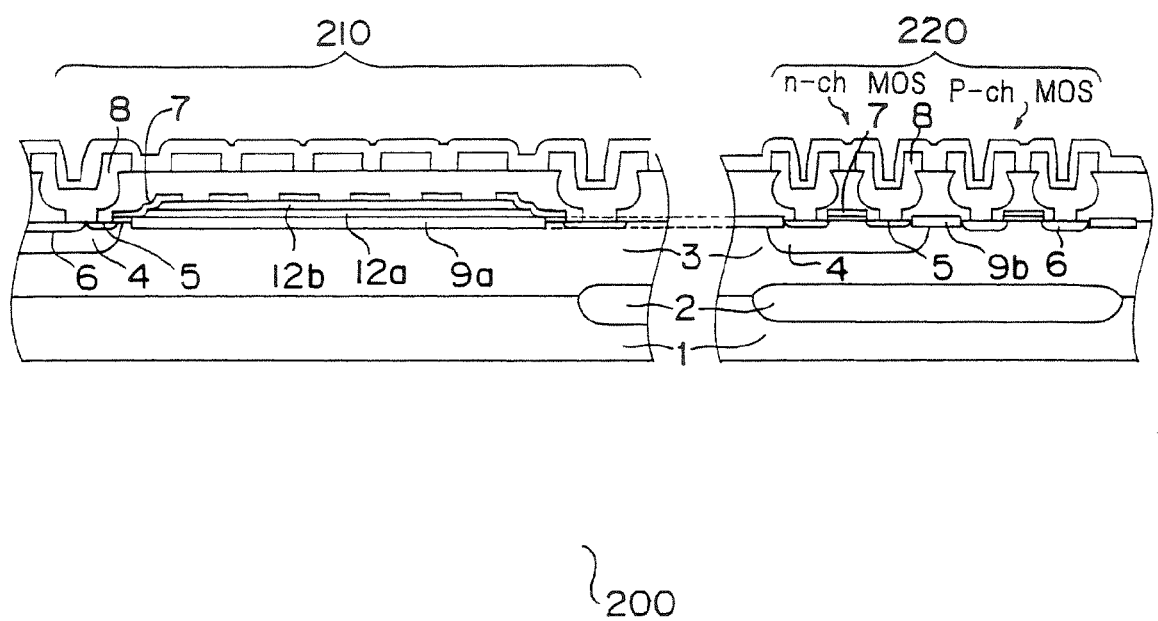
FIG. 4 is a cross sectional view of a semiconductor device according to an embodiment 2 of the present invention.

FIG. 4 is a cross sectional view of the semiconductor device according to the embodiment 2 of the present invention, generally denoted at 200. The semiconductor device 200 includes a high voltage element region 210 in which there is an MOS transistor (high voltage element) and a low voltage element region 220 in which there is a CMOS transistor (low voltage element). In FIG. 4, those portions denoted at the same reference symbols as those used in FIG. 1 denote the same or corresponding portions.

In the semiconductor device 200, a silicon oxide film formed by CVD method is multi-layer structures 12a and 12b whose edge portions are stepped. A polysilicon electrode 7 is disposed on the silicon oxide films. In consequence, the polysilicon electrode 7 which will serve as a field plate (FP) becomes stepped. This semiconductor device is otherwise similar in structure to the semiconductor device 100 described above.

In the semiconductor device 200, the polysilicon electrode 7 forming the field plate is thus stepped, and therefore, the first-stage field plate of the high voltage element (the far-left field plate) mitigates stepwise an electric field which develops at the surface of the semiconductor substrate 1 right under this field plate, thereby easing a local concentration of the electric field. CVD oxide films whose multi-layer structures contain three or more layers may be used.

Figure 5A:
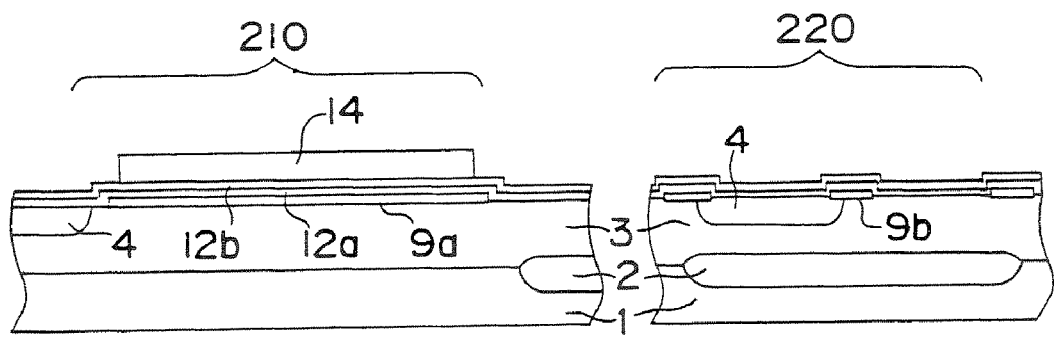
FIGS. 5A through 5C show cross sectional views of steps for manufacturing the semiconductor device according to the embodiment 2 of the present invention.
Figure 5B:
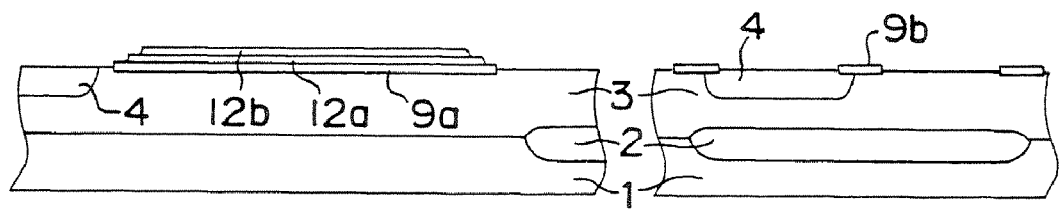
Figure 5C:
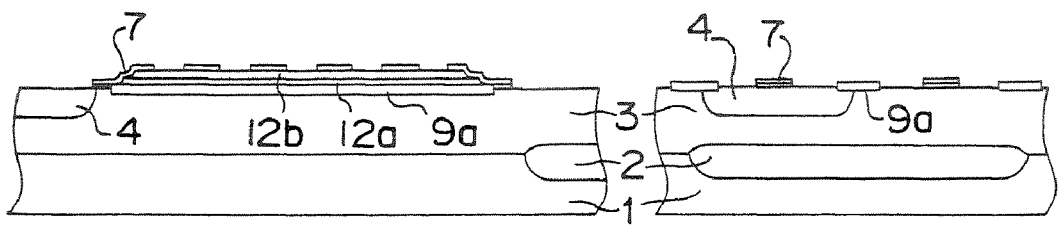

A method of manufacturing the semiconductor device 200 will now be described with reference to FIG. 5. FIG. 5 shows, in cross section, steps for manufacturing the semiconductor device 200. In FIGS. 5A through 5C, those portions denoted at the same reference symbols as those of FIG. 1 denote the same or corresponding portions. This manufacturing method includes the following steps.

Shown on the left-hand side in FIGS. 5A through 5C is the high voltage element region 210, whereas shown on the right-hand side is the low voltage element region 220.

Step 1: After similar steps to those shown in FIGS. 2A through 2D described above, a silicon oxide film 12a is formed by a CVD method as shown in FIG. 5A. This is followed by thermal processing at 900° C. for 60 minutes in a nitrogen atmosphere for instance. Under a similar CVD condition to that for the silicon oxide film 12a, a silicon oxide film 12b is then formed. The silicon oxide film 12b will not be thermally treated. It is ensured that the total of the film thicknesses of the silicon oxide films 12a and 12b is equal to that of the silicon oxide film 12 according to the embodiment 1. The film thickness of the silicon oxide film 12a is preferably approximately the same as that of the silicon oxide film 12b. Following this, the photolithographic resist mask 15 is formed. The resist mask 15 is formed on the silicon oxide film 12a above the silicon oxide film 9a.

Step 2: As shown in FIG. 5B, the silicon oxide films 12a and 12b are wet-etched using the resist mask 15. Thermal processing (densification) of a silicon oxide film will alter the film quality of the silicon oxide film and change the etching speed. How dense the silicon oxide film 12a and the silicon oxide film 12b become is different depending upon whether thermal processing (densification) is executed or not, and the etching speed of the silicon oxide film 12a becomes slower than that of the silicon oxide film 12b. The edge portions of the silicon oxide films 12a and 12b therefore become stepped. The resist mask 14 is removed after the etching step.

Step 3: As shown in FIG. 5C, the polysilicon electrode 7 is formed. In the edge portions of the silicon oxide films 12a and 12b, the polysilicon electrode 7 as well becomes stepped. This is followed by execution of the step shown in FIG. 2G and the subsequent steps, which completes the semiconductor device 200.

Embodiment 3

Figure 6:
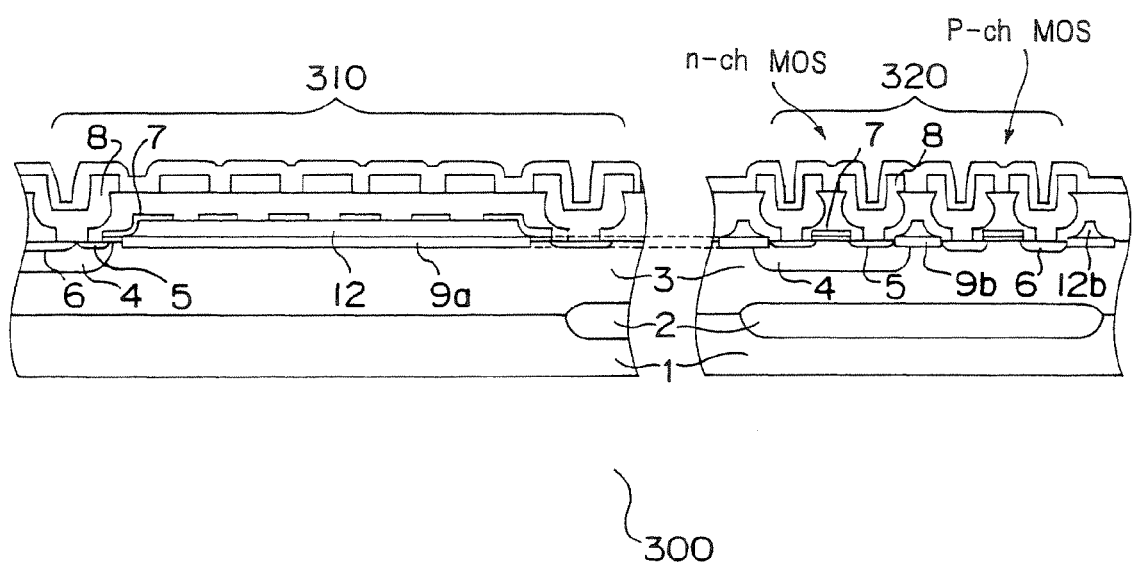
FIG. 6 is a cross sectional view of a semiconductor device according to an embodiment 3 of the present invention.

FIG. 6 is a cross sectional view of the semiconductor device according to the embodiment 3 of the present invention, generally denoted at 300. The semiconductor device 300 includes a high voltage element region 310 in which there is an MOS transistor (high voltage element) and a low voltage element region 320 in which there is a CMOS transistor (low voltage element). In FIG. 6, those portions denoted at the same reference symbols as those used in FIG. 1 denote the same or corresponding portions.

In the semiconductor device 300, the silicon oxide film 12b as well is formed by a CVD method on the silicon oxide film (LOCOS oxide film) 9b belonging to the low voltage element region 320. This semiconductor device is otherwise similar in structure to the semiconductor device 100 according to the embodiment 1.

The silicon oxide film (LOCOS oxide film) 9b of the low voltage element region needs to have such a thickness which will not permits inversion of an electric potential at the surface of the semiconductor substrate 1 which is located in a bottom section of the silicon oxide film 9b even despite application of a voltage upon an electrode, an interconnection or the like which are disposed in an upper section of the silicon oxide film 9b.

In the semiconductor device 300 according to the embodiment 3, the silicon oxide film 12b stacked on the silicon oxide film 9b ensures a sufficiently long distance between the aluminum electrode 8 and the surface of the silicon substrate 1 for example, which in turn prevents inversion of an electric potential at the surface of the semiconductor substrate 1. To be noted in particular, even when a high transient voltage is applied upon the aluminum electrode 8, it is possible to sufficiently prevent inversion of an electric potential at the surface of the semiconductor substrate 1. The consequence of this is the semiconductor device 300 which is highly reliable.

Figure 7A:
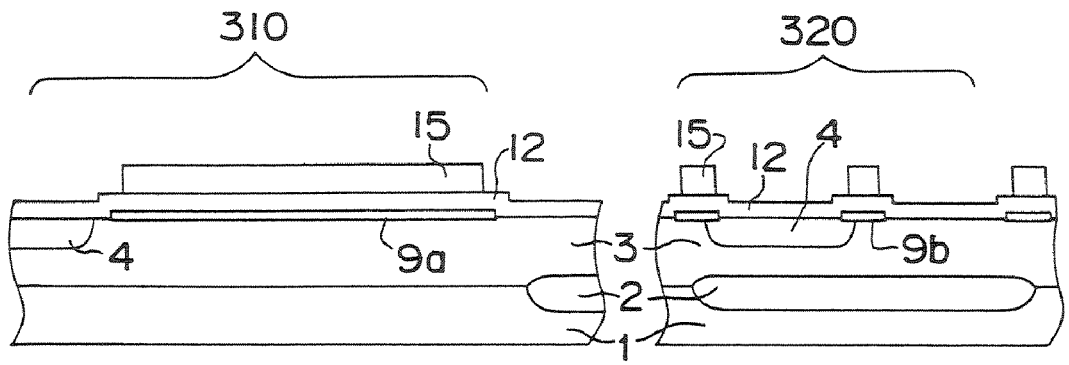
FIGS. 7A through 7C show cross sectional views of steps for manufacturing the semiconductor device according to the embodiment 3 of the present invention.
Figure 7B:
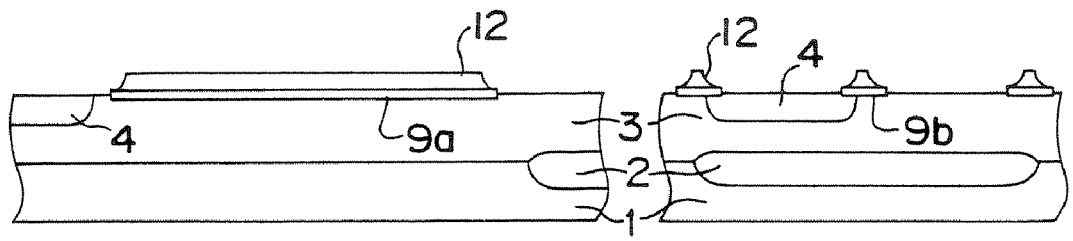
Figure 7C:
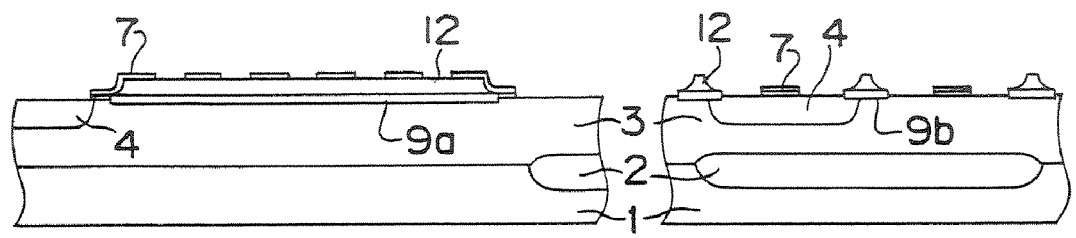
Figure 8:
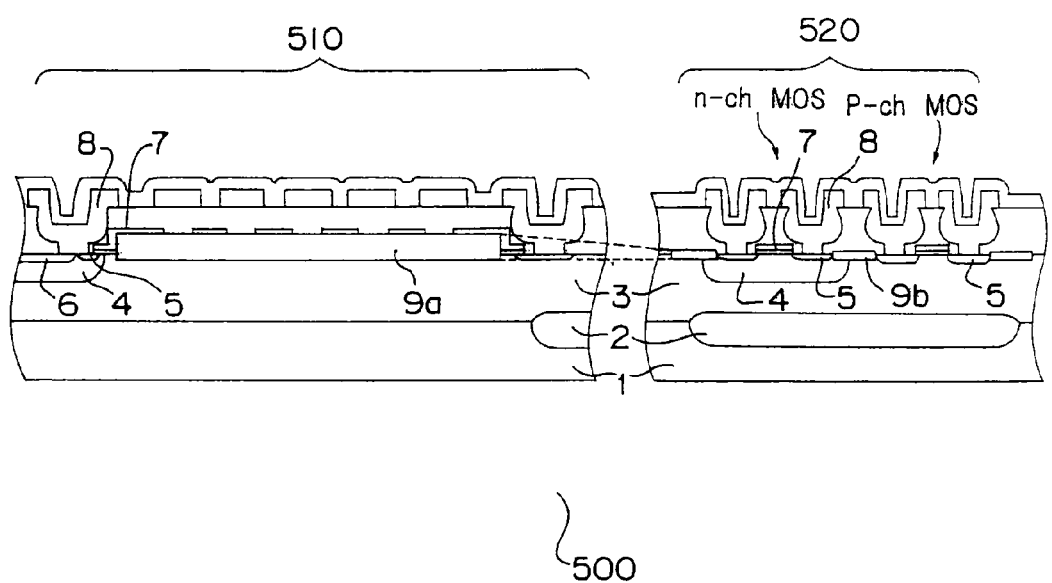
FIG. 8 is a cross sectional view of a conventional semiconductor device.

A method of manufacturing the semiconductor device 300 will now be described with reference to FIGS. 7A through 7C. FIGS. 7A through 7C show cross sectional views of steps for manufacturing the semiconductor device 300. In FIGS. 7A through 7C, those portions denoted at the same reference symbols as those used in FIG. 1 denote the same or corresponding portions. This manufacturing method includes the following steps.

Shown on the left-hand side in FIGS. 7A through 7C is the high voltage element region 310, whereas shown on the right-hand side is the low voltage element region 320.

Step 1: After similar steps to those shown in FIGS. 2A through 2D described above, the silicon oxide film 12 is formed by a CVD method as shown in FIG. 7A. Following this, the photolithographic resist mask 15 is formed. The resist mask 15 is formed on the silicon oxide film 12 above the silicon oxide film 9a belonging to the high voltage element region 310 and also on the silicon oxide film 12 above the silicon oxide film 9b belonging to the low voltage element region 320.

Step 2: As shown in FIG. 7B, the silicon oxide film 12 is wet-etched using the resist mask 15. As a result, the silicon oxide film 12 is formed above the silicon oxide film 9a belonging to the high voltage element region 310 and also above the silicon oxide film 9b belonging to the low voltage element region 320.

Step 3: As shown in FIG. 7C, the polysilicon electrode 7 is formed. This is followed by execution of the step shown in FIG. 2G and the subsequent steps, which completes the semiconductor device 300.

Where the method of manufacturing the semiconductor device 300 according to the embodiment 3 is used, the total of the film thicknesses of the silicon oxide films (the sum of the film thickness of the silicon oxide film 9a and that of the silicon oxide film 9b) may be thick while maintaining the film thickness of the silicon oxide film (LOCOS oxide film) 9b thin as heretofore practiced in the low voltage element region 320. In other words, since the film thickness of the silicon oxide film (LOCOS oxide film) 9b may be thin, it is possible to fabricate the semiconductor device 300 which has a finer topography and a higher level of integration.

What is claimed is:

1. A semiconductor device that comprises a high voltage element and a low voltage element, said device comprising:
   a semiconductor substrate having high voltage element region where said high voltage element is present, and a low voltage element region where said low voltage element is present;
   a first isolation structure present in said high voltage element region; and
   a second isolation structure present in said low voltage element region, wherein said first isolation structure comprises a first LOCOS oxide film present on a surface of said semiconductor substrate, an isolated CVD oxide film obtained by etching an oxide film deposited by CVD on said first LOCOS oxide film, and an electrode present on said isolated CVD oxide film,
   said second isolation structure consisting of:
      a $n^+$ diffusion layer buried in said semiconductor substrate;
      a $n^-$ epitaxial layer;
      a $p^-$ diffusion layer;
      a $n^+$ diffusion region present in the $p^-$ diffusion layer;
      a $p^+$ diffusion region present in the $n^-$ epitaxial layer;
      a polysilicon electrode present on an oxide film;
      at least one second LOCOS oxide film;
      an insulation layer;
      an aluminum electrode present on said insulation layer; and
      a silicon nitride protection film present on said aluminum electrode, where a thickness of the first LOCOS oxide film of said first isolation structure is approximately the same as a thickness of the second LOCOS oxide film of said second isolation structure.

2. The semiconductor device according to claim 1, wherein said isolated CVD oxide film has a multi-layer structure of at least a lower CVD oxide film layer and a upper CVD oxide film layer present on said lower CVD oxide film layer, and said isolated CVD oxide film has a stepped edge portion of said lower CVD oxide film layer and said upper CVD oxide film layer.

3. The semiconductor device according to claim 2, wherein a field plate covers said stepped edge portion.

4. A method of manufacturing a semiconductor device according to claim 1, comprising:
   forming a high voltage element region in a semiconductor substrate where said high voltage element is located;
   forming a low voltage element region in said semiconductor substrate where said low voltage element is located;
   simultaneously forming a first LOCOS oxide film on said high voltage element region and at least one second LOCOS oxide film on said low voltage element region;
   depositing by CVD a CVD oxide film on at least said first LOCOS oxide film on said high voltage element region; and
   etching said CVD oxide film thereby forming an isolated CVD oxide film, isolated on said first LOCOS oxide film.

5. The manufacturing method according to claim 4, further comprising:
   forming a nitrogen film on a surface of said semiconductor substrate before forming said LOCOS oxide films;
   wherein said etching comprises:
   forming said CVD oxide film on said nitrogen film;
   etching said CVD oxide film using a mask formed on said CVD oxide film and leaving said CVD oxide film so that said CVD oxide film overlaps with said nitrogen film at its circumference; and
   wet-etching said CVD oxide film and removing an overlapping section of said CVD oxide film which overlaps with said nitrogen film.

6. The manufacturing method according to claim 4, wherein said etching comprises:
   forming a lower CVD oxide film layer on said LOCOS oxide film and thermally processing said lower CVD oxide film layer;

forming an upper CVD oxide film layer on said lower CVD oxide film layer; and wet-etching said upper CVD oxide film layer and said lower CVD oxide film layer using a mask formed on said upper CVD oxide film layer, and thereby forming said CVD oxide film having a stepped edge portion formed of said upper CVD oxide film layer and said lower CVD oxide film.

7. The semiconductor device according to claim 1, wherein each of said LOCOS oxide films has a thickness ranging from 100 to 800 nm.

8. The semiconductor device according to claim 1, wherein said isolated CVD oxide film has a thickness ranging from 300 to 2000 nm.

9. The semiconductor device according to claim 1, wherein each of said LOCOS oxide films has a thickness of from 100 to 800 nm; and said isolated CVD oxide film has a thickness of from 300 to 2000 nm.

10. The method according to claim 4, wherein each of said LOCOS oxide films has a thickness ranging from 100 to 800 nm.

11. The method according to claim 4, wherein said isolated CVD oxide film has a thickness ranging from 300 to 2000 nm.

12. The method according to claim 4, wherein each of said LOCOS oxide films has a thickness of from 100 to 800 nm; and said CVD oxide film has a thickness of from 300 to 2000 nm.

13. The method according to claim 6, wherein said thermal processing occurs at a temperature of 900° C. for 60 minutes.

14. A semiconductor device having a high voltage element and a low voltage element, the semiconductor device comprising:

a semiconductor substrate having high voltage element region where said high voltage element is present, and a low voltage element region where said low voltage element is present;

a first isolation structure disposed in said high voltage element region; and a second isolation structure disposed in said low voltage element region, wherein said first isolation structure comprises a first LOCOS oxide film present on a surface of said semiconductor substrate, a CVD oxide film present on said first LOCOS oxide film, a polysilicon electrode present on said CVD oxide film, and an aluminum electrode present in a $n^+$ diffusion region of said high voltage element region of said semiconductor substrate;

said second isolation structure comprises a second LOCOS oxide film and a polysilicon electrode present thereon, wherein each of said LOCOS oxide films has a thickness of from 100 to 800 nm; and said CVD oxide film has a thickness of from 300 to 2000 nm.

15. The semiconductor device according to claim 1, wherein said isolated CVD oxide film is completely covered by at least one of said insulation layer and a protection film.

16. The semiconductor device according to claim 14, wherein said CVD oxide film is completely covered by at least one of an insulation layer and a protection film.

17. The semiconductor device according to claim 1, wherein said isolated CVD oxide film is completely contacted on an upper surface by at least one of said insulation layer and a protection film.

18. The semiconductor device according to claim 14, wherein said CVD oxide film is completely contacted on an upper surface by at least one of an insulation layer and a protection film.

19. The semiconductor device according to claim 1, which is obtained by a process comprising:

depositing a pad oxide layer and a nitride film on said semiconductor substrate, where said pad oxide layer contacts said semiconductor substrate and said nitride film contacts said pad oxide layer;

patterning said nitride film between a photoresist to expose a patterned surface of said substrate;

selectively oxidizing said patterned surface to form said first and second LOCOS oxide layers;

depositing a CVD oxide layer on said first and second LOCOS oxide layers;

wet etching said CVD oxide layer thereby patterning said CVD oxide layer present on said first oxide layer; and removing said CVD oxide layer present on said second LOCOS oxide layer.

* * * * *